United States Patent [19]

Kruer et al.

[11] 4,117,329
[45] Sep. 26, 1978

[54] ROOM-TEMPERATURE, THIN-FILM, PBS PHOTOCONDUCTIVE DETECTOR HARDENED AGAINST LASER DAMAGE

[75] Inventors: Melvin R. Kruer, Oxon Hill, Md.; Leon Esterowitz, Springfield, Va.; Filbert J. Bartoli, Upper Marlboro, Md.; Roger E. Allen, Alexandria, Va.

[73] Assignee: The United States of America as represented by the Secretary of the Navy, Washington, D.C.

[21] Appl. No.: 790,130

[22] Filed: Apr. 22, 1977

[51] Int. Cl.² ........................... G01J 1/00; G01T 1/22
[52] U.S. Cl. ..................................... 250/338; 250/370
[58] Field of Search ............... 250/338, 339, 340, 352, 250/370, 371

[56] References Cited

U.S. PATENT DOCUMENTS 3,109,097  10/1963  Waard et al. ........................ 250/352

OTHER PUBLICATIONS von Gutfeld, R. J., "Infrared Detector", IBM Technical Disclosure Bulletin, vol. 8, No. 9 (1966), 1255–1256.

Primary Examiner—Alfred E. Smith
Assistant Examiner—Janice A. Howell
Attorney, Agent, or Firm—R. S. Sciascia; Philip Schneider; William C. Daubenspeck

[57] ABSTRACT

A photoconductive detector comprising a thin film of photoconductive material deposited on a thin substrate of high thermal conductivity having a surface area that is large relative to the detector's absorbing surface area. The back surface of the substrate is metalized and soldered to a high-thermal-conductivity, large-thermal-mass heat buffer which is coupled to a heat sink. The resulting detector is hardened against damage resulting from laser irradiation.

16 Claims, 5 Drawing Figures

ROOM-TEMPERATURE, THIN-FILM, PBS PHOTOCONDUCTIVE DETECTOR HARDENED AGAINST LASER DAMAGE

BACKGROUND OF THE INVENTION

This invention relates in general to thin-film, infrared, photoconductive detectors and, more particularly, to the hardening of such detectors against damage resulting from laser irradiation.

The threat of laser countermeasures against military electrooptical systems has created a need for infrared detectors hardened against damage from intentional laser irradiation. Unintentional irradiation may also damage the detectors. Infrared detectors of the type that use a thin film of photoconductive material as the active detector medium are widely used for various heat and object-sensing applications. In particular, room-temperature, lead sulfide (PbS), thin-film, photoconductive detectors are a popular choice for sensor systems operating in the 1-3 μm atmospheric spectral window.

Although much effort has been given to sensitizing thin-film detectors, they have not been designed for optimum heat transfer. Consequently, their ability to dissipate absorbed power is usually quite poor and they are susceptible to laser damage.

The thin film of photoconductive material (such as a thin film of PbS, typically 1 μm in thickness) must of necessity be deposited on a substrate to provide mechanical support and stability. (It must also be non-conducting to provide electrical isolation for the film.) This substrate, of course, normally provides some heat-dissipation capability for the detector. However, in the area of temperature control, the main concern in prior-art thin-film detectors has been the maintenance of the photoconductive film at a temperature at which the detector will function most efficiently, that is, maintaining a temperature at which there is a high photoconductive gain. Thus, the prior-art detectors are designed to remove heat generated by biasing currents, and normal non-intensive radiation and thus maintain normal operating temperatures.

However, intensive laser irradiation causes much higher thermal loading which may raise the temperature to the point where permanent degradation or complete loss of detector responsivity results if the detector cannot dissipate the incident energy. For example, it has been found that the onset of damage may occur in thin-film, PbS, photoconductive detectors when the detector is heated to approximately 600° K. by laser irradiation.

SUMMARY OF THE INVENTION

The present invention provides a thin-film, infrared, photoconductive detector that is hardened against laser irradiation. The detector provides efficient heat flow from the thin film to a heat sink so that the thin film does not reach the temperature which will cause permanent degradation of detector sensitivity.

A detector according to the present invention includes a thin film of photoconductive material deposited on a substrate that provides efficient heat flow from the thin film. The substrate is mounted on a high-thermal-conductivity, large-thermal-mass heat buffer by an interface of negligible thermal impedance, and the heat buffer is coupled to a conventional heat sink. More specifically, the substrate is of high thermal conductivity and has a surface area which is large relative to the absorbing surface area of the thin film. The thickness of the substrate is chosen to provide the most efficient heat flow from the film and the interface of negligible thermal impedance includes a metalized back-surface of the substrate and a bonding layer of solder.

DESCRIPTION OF THE PREFERRED EMBODIMENT

Figure 1:
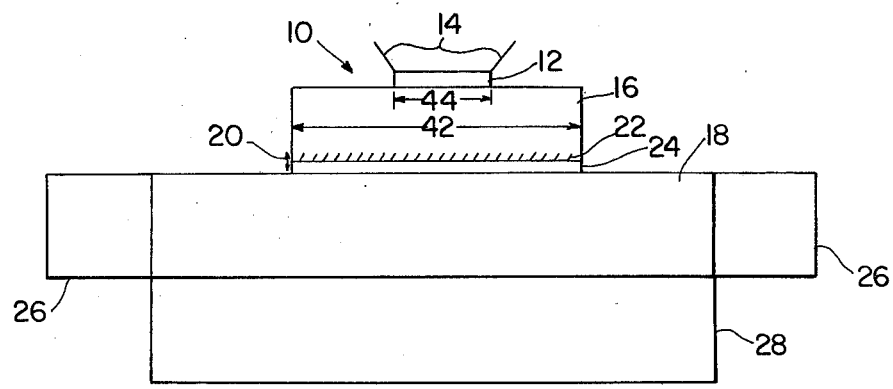
FIG. 1 is a schematic cross-sectional view of a thin-film photoconductive detector according to the present invention.

FIG. 1 shows a thin-film, photoconductive, infrared detector 10 incorporating the laser hardening techniques of the present invention. The active detecting layer is a thin film 12 of photoconductive material which is sensitive to infrared radiation at ordinary room temperatures (approximately 290° K. to 310° K.), such as a thin film of PbS, typically 1 μm in thickness and 0.25-10.mm$^2$ in surface area. Electrical connection is made to the thin film in a conventional manner as indicated by electrical leads 14.

The thin film 12 is deposited by conventional techniques on a substrate 16, which as previously noted, provides mechanical stability and electrical isolation for the thin film. The substrate 16 is mounted on a metal heat buffer 18 by means of an interface 20 of negligible thermal impedance. The interface 20 includes a metalized back-surface 22 of substrate 16 and a bonding layer 24. As will be described hereinafter, the characteristics of the substrate 16, the heat buffer 18, and the interface 20 are very important in hardening the detector against damage due to laser irradiation and constitute novel features of the present detector.

The detector 10 (specifically heat buffer 18) is mounted on a conventional heak sink as shown conceptually at 26 and 28.

Since laser irradiation may result in high thermal loading of thin-film detectors, the thermal configuration of a detector is important in determining its susceptibility to damage from optical radiation. To prevent irreversible detector damage, the heat generated by the laser irradiation must be dissipated so that the thin film does not reach the critical temperature where detector degradation begins. This is approximately 600° K. in a PbS detector. The detector of the present invention is designed to provide efficient heat flow from the thin film to prevent such detector degradation.

Figure 2:
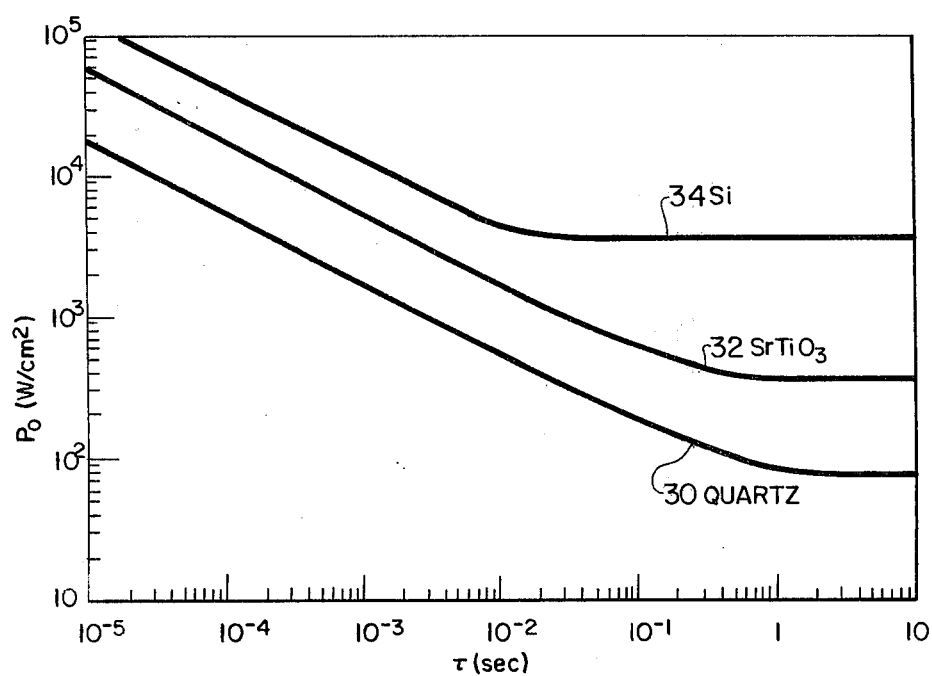
FIG. 2 illustrates the effect of the thermal conductivity of the substrate in determining the detector damage thereshold.

Considering first the design of substrate 16, the thermal conductivity of the substrate, the thickness of the substrate, and the surface area of the substrate relative to the detector absorbing area are important factors in hardening the detector against laser irradiation. FIG. 2 shows the calculated power density $P_o$ for heating thin films of PbS on substrates of quartz, strontium titanate and silicon (shown by curves 30, 32, and 34, respectively) from 300° K. to 600° K. (the damage threshold temperature) as a function of irradiation time $\tau$. The substrates are of the same thickness and have very good thermal contact with a heat sink so that heat flow within the detector is not limited by an interface layer which might confine the heat within the substrate. Further explanation of the calculations referred to herein may be found in "Thermal Analysis of Laser Damage in the Thin-film Photoconductors", Journal of Applied Physics, Vol. 47, No. 7, July 1976, authored by the inventors of the present application.

As shown in FIG. 2, $P_o$ is strongly dependent on substrate material over a wide range of irradiation times. For times between $10^{-5}$ and $10^{-2}$ sec, the damage thresholds for detectors on silicon substrates are about seven times those for detectors on quartz and about two times those for detectors on strontium titanate. A comparison of the magnitudes of the damage thresholds for the different substrates at a specific irradiation time in this range indicates that $P_o$ is approximately proportional to the square root of substrate thermal conductivity. (For example, the thermal conductivity of silicon is about 50 times that of quartz). For long times, the ratio of damage thresholds for silicon and quartz increases to 50 indicating the $P_o$ is proportional to thermal conductivity. This analysis indicates that, for applications where thin-film photoconductors will be subject to intense radiation, the substrate should be fabricated from materials such as silicon or sapphire which have large thermal conductivities. The advantages of using a silicon or sapphire substrate over quartz become even greater for detectors operating at intermediate or low temperatures. For example, at 77° K., the thermal conductivity of silicon is three orders of magnitude greater than that of quartz, as compared to the factor of 50 at room temperature. Accordingly, materials that have high thermal conductivities such as silicon (1.5 W/cm-K) and sapphire (0.33 W/cm-K) are preferred materials for use as substrate 16 in the present invention.

Figure 3:
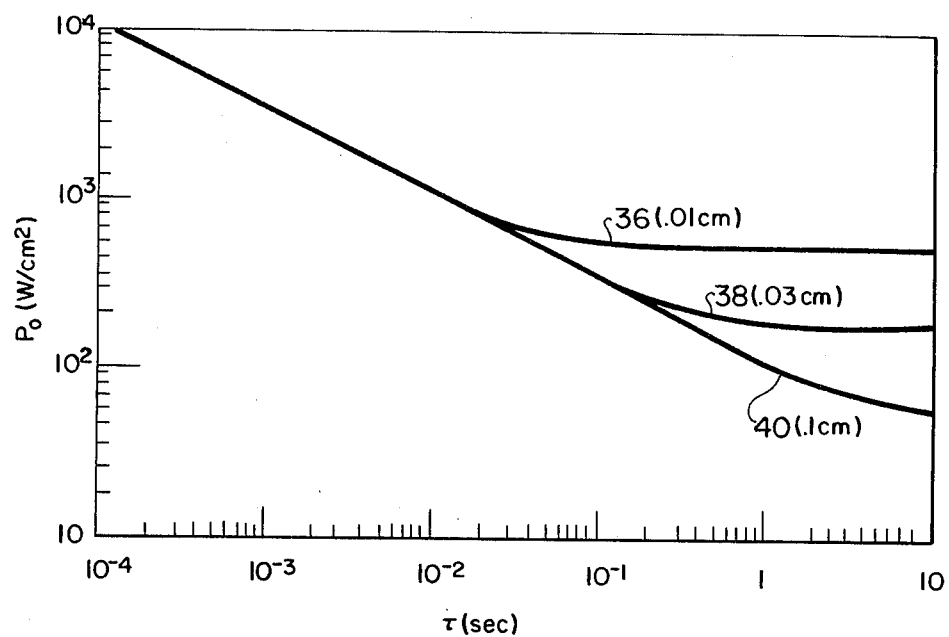
FIG. 3 illustrates the effect of the thickness of the substrate determining the detector damage threshold.

The substrate thickness also has an effect on heat flow in the detector. Consider a detector on a quartz substrate which is bonded to a heat sink by an adhesive layer with a large thermal conductance per unit area ($h = 10$ W/cm$^2$K.) so that the bonding layer does not limit heat flow. The calculated power density $P_o$ required to heat a thin film from 300° to 600° K. is shown in FIG. 3 as a function of irradiation time for three different substrate thicknesses. The thicknesses used in the calculation to generate curves 36, 38 and 40 are 0.01 0.03 and 0.1 cm, respectively. For sufficiently short times ($\tau < 10$ msec), heat does not diffuse to the rear of the substrate and $P_o$ is independent of substrate thickness. The substrate thickness can have a large effect on $P_o$ if the pulse duration is longer than 50 msec. For very large $\tau$, heat is conducted to the heat sink at the same rate it is deposited by the optical radiation. In this limit, $P_o$ asymptotically approaches a constant value independent of $\tau$ and is inversely proportional to substrate thickness.

Therefore, decreasing the substrate thickness will improve detector resistance to laser irradiation if the thermal conductivity between the substrate and the heat sink is better than the thermal conductivity within the substrate. It is noted that the substrate must be of sufficient thickness to supply mechanical stability for the thin films.

The heat flow in the detector will also be improved if the substrate surface area, as indicated by 42 in FIG. 1, is made large compared to the absorbing detector area, as indicated by 44 in FIG. 1. This will allow transverse heat flow within the substrate 16, as well as heat flow in the direction of optical radiation, to contribute to the power dissipation of the detector.

Figure 4:
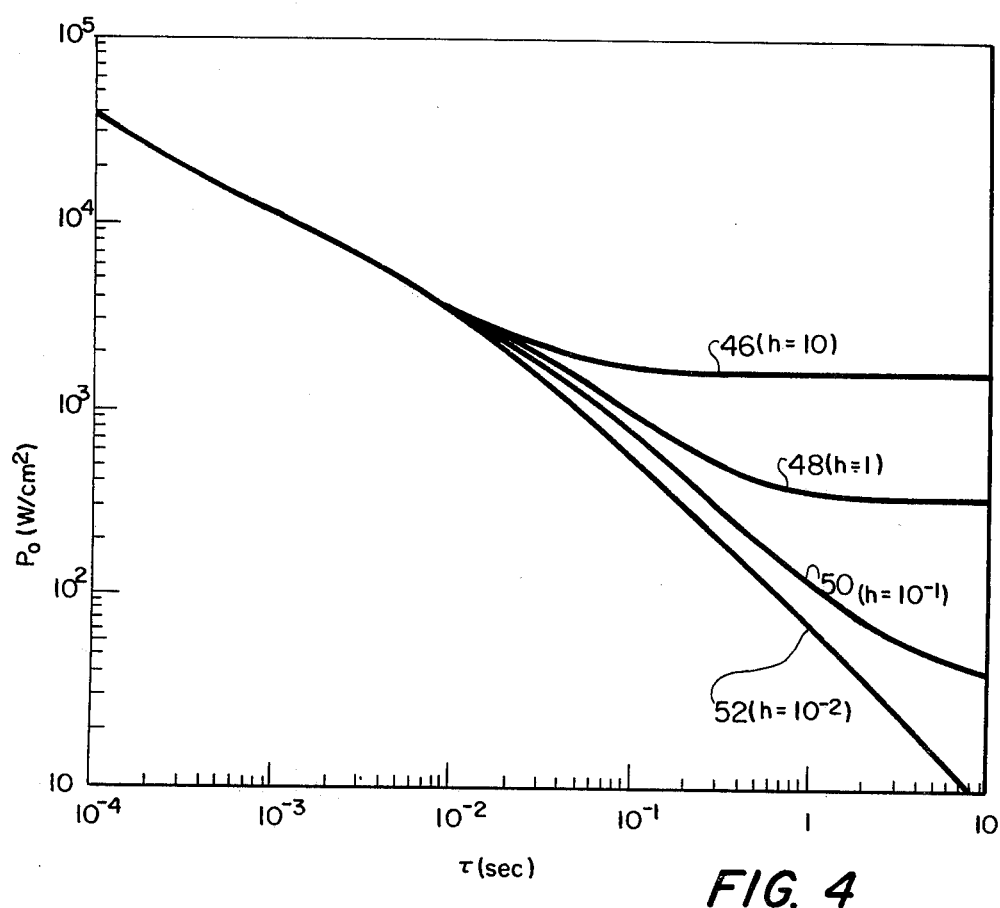
FIG. 4 illustrates the effect of the thermal conductivity of the interface in determining the detector damage threshold.

Considering now the design of the interface 20, if a thin highly-conductive material is used for the detector substrate 16, the interface 20 may become a thermal bottleneck. This bottleneck becomes important at long times when heat has had time to diffuse to the rear of the substrate. FIG. 4 shows the calculated power density thresholds $P_o$ for PbS thin films on silicon substrates assuming several values for the thermal conductance per unit area ($h$) of the interface 20. The damage thresholds depicted by curves 46, 48, 50, and 52 were calculated using values of the $h$ equal to 10, 1, $10^{-1}$, and $10^{-2}$ W/cm$^2$K, respectively. For $\tau < 10$ msec, the thermal conductance of the interface 20 is not important and the calculated threshold is the same for the four values of $h$ used. For irradiation times $\tau < 1$ sec, the above variation in $h$ changes the calculated power density threshold $P_o$ by several orders of magnitude.

In the preferred embodiment of detector 10, the back-surface of the substrate 16 is metalized at 22 with a metal of high thermal conductivity, such as silver or copper, by conventional precesses such as diffusion. This metalized surface has the effect of increasing the thermal conductivity at the back of the substrate 16, and also providing a metal layer so that a highly-thermally-conductive material such as solder may be used as the bonding layer 24 between the substrate and the metal heat buffer.

It can be seen that thermal conductance of the interface 20 is relatively more important if the substrate is efficient in transferring heat from the absorbing surface of the detector. If the interface layer 20 is less efficient in transferring heat than the substrate 16, the heat generated by the laser radiation will build up in the substrate.

It should be clear that if interface layer 20 has a higher thermal conductivity than substrate 16, the substrate should be as thin as possible considering requirements of mechanical support, electrical isolation, and formation of the metalized back surface. These factors require a minimum substrate thickness of approximately 0.005 cm. Alternatively, if interface layer 20 has a lower thermal conductance than substrate 16, it is advantageous to have a substrate of a larger thickness so that the substrate may dissipate more heat itself.

The use of a heat buffer 18 is the final novel feature of a detector according to the present invention. Heat buffer 18 is a high-thermal-conductivity, large-thermal-mass in intimate thermal contact with the substrate 16 (via interface 20) and it has a two-fold function. The first function is to remove heat from interface 20 as rapidly as possible and redistribute it throughout the entire buffer to eliminate any appreciable heat build up in the region behind the interface. This requires a high-thermal conductivity material. The second function is to act as a high-specific-heat thermal reservoir until heat can be removed to the heat sink. The large thermal mass of the heat buffer maintains the heat buffer (and therefore the detector) at a low temperature. For long optical irradiation times, heat can be effectively conducted into the heat sink and the function of the heat buffer becomes simply an effective conduit for heat transport. Copper is a preferred material for use as the heat buffer 18.

The type of heat sink used with detector 10 will depend on the particular application. Frequently the detector 10 is surrounded circumferentially by a ring which acts as a heat sink as shown at 26 in FIG. 1. Alternatively, the detector 10 may be mounted on a heat sink such as shown at 28. In that case, the heat sink 28 and the heat buffer 18 may be combined in a single piece of highly-thermally-conductive material such as copper.

Figure 5:
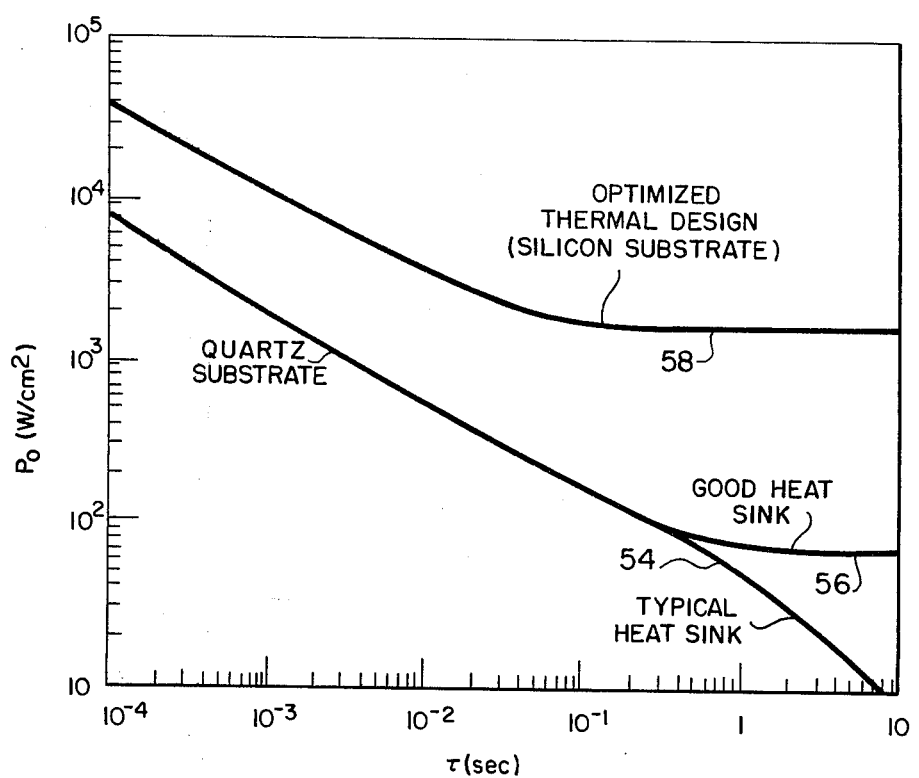
FIG. 5 illustrates the improvement in the detector damage threshold provided in a detector according to the present invention.

The preceding analysis shows that thin-film photoconductors can withstand laser irradiation of much higher power if they are fabricated on thin, highly thermally conductive substrates which are efficiently coupled to heat sinks. These results are summarized in FIG. 5. Curve 54 is the threshold for onset of damage of PbS photoconductors on a quartz substrate assuming the thermal conductance per unit area of the bonding layer is 0.01 W/cm$^2$K. This thermal configuration is typical of that found in many prior PbS applications. Curve 56 refers to thresholds for PbS detectors on quartz substrates with higher thermal conductance per unit area of the bonding layer. Curve 58 is the calculated threshold for a silicon substrate with a bonding layer having the same thermal conductance per unit area as the bonding layer in curve 56. These calculations show that an optimized thermal design can significantly increase the damage threshold for all irradiation times shown. In particular, for a 10-second irradiation time, the damage thresholds can be increased by more than two orders of magnitude. These considerations are particularly important for detectors exposed to chopped radaition or repetitively pulsed lasers where the energy of one pulse may not damage the detector but the integrated power may.

Although the present invention has been described with application to room temperature PbS detectors, it is noted that other thin-film photoconductive detectors may be hardened against laser damage by using the techniques of the present invention. For example, a thin-film lead selenide (PbSe) detector (which operates at liquid nitrogen temperature) may be hardened against laser irradiation by fabrication on a thin, highly-conductive substrate which is mounted on a heat buffer by means of a highly-conductive interface. The heat sink in this case must be capable of maintaining the required operating temperature in the liquid-nitrogen Dewar.

It is also noted that when the word "high" is used to describe the thermal conductivity of the substrate 16 in the present specification, a thermal conductivity of approximately 0.25 W/cm-K to 15 W/cm-K is denoted. When the term "high" is used to describe the thermal conductivity of the heat buffer 18 or the bonding layer 24, a thermal conductivity of approximately 0.5 W/cm-K to 20 W/cm-K is denoted. For example, silicon would be a material having a thermal conductivity within the former range and copper would be a material within the latter range. It is further noted that when the word "thin" is used to describe the substrate 16, a substrate of approximately 0.005 cm to 0.025 cm in thickness is denoted.

Obviously, many modifications and variations of the present invention are possible in light of the above teachings. It is therefore to be understood that within the scope of the appended claims, the invention may be practiced otherwise than as described.

What is claimed and desired to be secured by Letters Patent of the United States is:

1. A thin-film infrared detector hardened against damage from laser irradiation comprising:
   a thin film of material sensitive to infrared radiation;
   a thin substrate upon the front-surface of which said thin film is deposited, said substrate having a high thermal conductivity to provide efficient heat flow from said thin film through said substrate, said substrate having a surface area that is large relative to the absorbing area of said thin film so that heat generated by irradiation will be distributed transversely within said substrate;
   a heat sink; and
   an interface of negligible thermal impedance between said substrate and said heat sink for removing heat from said substrate.

2. The detector of claim 1 wherein said thin film comprises lead sulfide.

3. The detector as recited in claim 1, wherein said interface of negligible thermal impedance comprises:
   a metalized back surface of said substrate, said back surface being metallized with a metal of high thermal conductivity; and
   a bonding layer of high thermal conductivity between said back-surface and said heat sink.

4. The detector of claim 3 wherein said bonding layer comprises solder.

5. The detector of claim 3 wherein said thin substrate is sapphire.

6. The detector of claim 3 wherein said thin substrate is silicon.

7. A thin-film, photoconductive, infrared detector hardened against damage from laser irradiation comprising:
   a thin film of photoconductor material sensitive to infrared radiation;
   a thin substrate upon the front-surface of which said thin film is deposited, said substrate having a high thermal conductivity to provide efficient heat flow from said thin film through said substrate, said substrate having a surface area that is large relative to the absorbing area of said thin film so that heat generated by said irradiation will be distributed transversely within said substrate, the back surface of said substrate being metallized with a metal of high thermal conductivity;
   a bonding layer of high thermal conductivity; and
   a heat buffer upon which said substrate is mounted, contact being made between said buffer and the metalized back surface of said substrate by said bonding layer said heat buffer having a high thermal conductivity to remove heat from said interface as rapidly as possible and redistribute it throughout the entire buffer to eliminate heat buildup in the region behind said interface, said heat buffer having a large thermal mass to act as a high-specific-heat thermal reservoir.

8. The detector of claim 7 further comprising a heat sink in good thermal contact with said heat buffer for removing heat from said heat buffer.

9. The detector of claim 7 wherein said thin substrate is sapphire.

10. The detector of claim 7 wherein said thin film comprises lead sulfide.

11. The detector of claim 10 wherein said heat buffer comprises copper.

12. The detector of claim 10 wherein said thin substrate is silicon.

13. A thin-film, photoconductive, infrared detector hardened against damage from laser irradiation comprising: a thin film of photoconductor material sensitive to infrared radiation;

a thin substrate upon the front-surface of which said thin film is deposited, said substrate having a high thermal conductivity to provide efficient heat flow from said thin film through said substrate, said substrate having a surface area that is large relative to the absorbing area of said thin film so that heat generated by said irradiation will be distributed transversely within said substrate;

an interface of negligible thermal impedance located on the back-surface of said substrate; and a heat buffer upon which said substrate is mounted, contact being made with said buffer by said interface, said heat buffer having a high thermal conductivity to remove heat from said interface as rapidly as possible and redistribute it throughout the entire buffer to eliminate heat buildup in the region behind said interface, said heat buffer having a large thermal mass to act as a high-specific-heat thermal reservoir.

14. The detector of claim 13 further comprising a heat sink in good thermal contact with said heat buffer for removing heat from said buffer.

15. The detector as recited in claim 13 wherein said interface of negligible thermal impedance comprises:

a metalized back-surface of said substrate, and a bonding layer of high thermal conductivity between said back-surface and said heat sink.

16. A detector of claim 15 wherein said bonding layer comprises solder.

* * * * *